United States Patent [19]

Jarrett et al.

[11] Patent Number: 5,664,060
[45] Date of Patent: Sep. 2, 1997

[54] MESSAGE MANAGEMENT METHODS AND APPARATUS

[75] Inventors: Boyce W. Jarrett, Austin, Tex.; Bindiganavale S. Nataraj, San Jose; Sakhawat M. Khan, Santa Clara, both of Calif.

[73] Assignee: Information Storage Devices, San Jose, Calif.

[21] Appl. No.: 186,793

[22] Filed: Jan. 25, 1994

[51] Int. Cl.⁶ .................. G10L 3/00; H04M 1/64
[52] U.S. Cl. .................. 704/270; 379/67; 704/278
[58] Field of Search .................. 395/2.84, 2.79, 395/2.09, 2.87; 379/67, 68, 89, 88; 360/12, 13, 18, 24, 32; 365/9, 33, 189.01–189.12

[56] References Cited

U.S. PATENT DOCUMENTS

| | | | |
|---|---|---|---|
| 4,703,368 | 10/1987 | Dakin | 386/101 |
| 4,785,473 | 11/1988 | Pfeiffer et al. | 379/89 |
| 4,813,014 | 3/1989 | DeBell | 365/45 |
| 4,821,311 | 4/1989 | Hashimoto | 379/88 |
| 4,965,569 | 10/1990 | Bennet et al. | 340/825.44 |
| 5,031,218 | 7/1991 | Galand et al. | 395/2.42 |
| 5,163,082 | 11/1992 | Karnowski | 379/88 |
| 5,388,064 | 2/1995 | Khan | 365/45 |
| 5,400,393 | 3/1995 | Knuth et al. | 379/88 |
| 5,576,491 | 11/1996 | Bozeman, Jr. | 73/491 |

OTHER PUBLICATIONS

IEEE Transactions on Cosumer Electronics; Ferris et al., "Design of a Full–Featured, Solid–State Telephone Answering Device", pp. 681–686. Aug. 1989.

Primary Examiner—Allen R. MacDonald
Assistant Examiner—Richemond Dorvil
Attorney, Agent, or Firm—Blakely, Sokoloff, Taylor & Zafman LLP

[57] ABSTRACT

Message management methods and apparatus for the storage and selective playback, erase and other manipulation of messages such as voice messages in a voice message system are disclosed. The devices of the invention include analog signal sample and analog storage capabilities whereby messages may be stored in one or more message segment storage locations. A register stack in each device keeps track of the message number associated with the message segment stored in the respective message segment location so that message segments associated with a particular message may be located in sequence for seamless playback of the entire message. Message segment storage locations available for storing new messages may be identified by a flag identifying the same, such as by an otherwise unused message number stored in the associated stack register. Each device includes the capability of cascading with identical devices so as to extend the total record and playback time available. Other aspects of the invention, including other features and capabilities of the devices and details of the method are disclosed.

19 Claims, 4 Drawing Sheets

MESSAGE MANAGEMENT METHODS AND APPARATUS

BACKGROUND OF THE INVENTION

1. Field of the Invention

The present invention relates to the field of solid state message storage and playback devices, such as voice signal storage and playback.

2. Prior Art

Message management, (more popularly known as "Garbage Collection"), is normally used to make more efficient use of a limited amount of expensive storage medium. The key concept behind garbage collection is to somehow logically connect all the available storage space into one contiguous space, even though the available storage space is physically fragmented in the storage medium. There are various techniques used in computer systems for the mass storage and retrieval of data files, with the garbage collection capability normally being provided by the operating system.

The present message management methods and apparatus are specifically intended for use in a solid state voice messaging chip where voice messages are stored in a solid state memory medium. More specifically, the preferred embodiment of the present invention is intended for use in integrated circuit form realized at least in part as part of analog storage devices of the type manufactured by Information Storage Devices of San Jose, Calif. By way of specific example, the ISD 1016 Single Chip Voice Message System is an analog storage device which has the capability of sequentially sampling and storing in analog voltage level form, an analog signal such as a voice signal, and playing back the stored samples on command so as to reconstruct the voice signal with sufficient fidelity to provide quality voice message annunciation for phone answering machines and other electronically controlled voice message systems. The ISD 1016 is a highly versatile device, as it includes as part of the integrated circuit a preamp, AGC, anti-aliasing filter and nonvolatile solid state analog signal storage as well as all support circuitry required to sample and store a voice signal in analog form, and to play the same back on command. These devices may also be cascaded so that n devices may be used to provide n times the record and playback time of a single device without additional support circuitry.

In the ISD 1016, a voice message may terminate at the end of the storage space, or be earlier terminated by the recording of a unique end of message (EOM) signal which, once initiated, will terminate the playback at that point. This, plus the ability to address starting points for playback, allows the storage and selective playback of multiple messages, and with additional control, the concatenation of words or short phrases to give different messages if desired. However, each message or message segment to be concatenated with another message segment must be in contiguous storage space, as the ISD 1016 cannot concatenate message segments in different memory space with a single starting signal. By way of specific example, if one recorded as the first message on an answering machine:

"Sorry, we are currently not in the office. Please leave a message following the beep."

and as a second message:

"Sorry, we are closed. Our normal hours are 8 to 5 weekdays. Please leave a message at the beep and we will return your call on our next business day."

a simple two state signal could select between the two messages. However if the first message was later changed to:

"Sorry, we are currently not in the office. Please leave a message following the beep, or call our other office at 123-4567."

it would likely overrun the second message, requiring re-recording of the second message also. Thus for applications wherein individual messages are to be selectively eliminated and new messages of variable length are to be recorded from time to time, a simple method and apparatus is desired to manage the memory space in a manner transparent to those recording and those playing back the remaining messages.

BRIEF SUMMARY OF THE INVENTION

Message management methods and apparatus for the storage and selective playback, erase and other manipulation of messages such as voice messages in a voice message system are disclosed. The devices of the invention include analog signal sample and analog storage capabilities whereby messages may be stored in one or more message segment storage locations. A register stack in each device keeps track of the message number associated with the message segment stored in the respective message segment location so that message segments associated with a particular message may be located in sequence for seamless playback of the entire message. Message segment storage locations available for storing new messages may be identified by a flag identifying the same, such as by an otherwise unused message number stored in the associated stack register. Each device includes the capability of cascading with identical devices so as to extend the total record and playback time available. Other aspects of the invention, including other features and capabilities of the devices and details of the method are disclosed.

DETAILED DESCRIPTION OF THE INVENTION

As stated before, the present message management method and apparatus are specifically intended for use in a solid state voice messaging chip wherein voice messages are stored in a solid state memory medium. More specifically, the preferred embodiment of the present invention is intended for use in integrated circuit form realized at least in part as part of analog storage devices of the type manufactured by information Storage Devices of San Jose, Calif. In the description to follow, first an overview of the message management method and apparatus will be described, and then details of a preferred implementation will be described.

Figure 1:
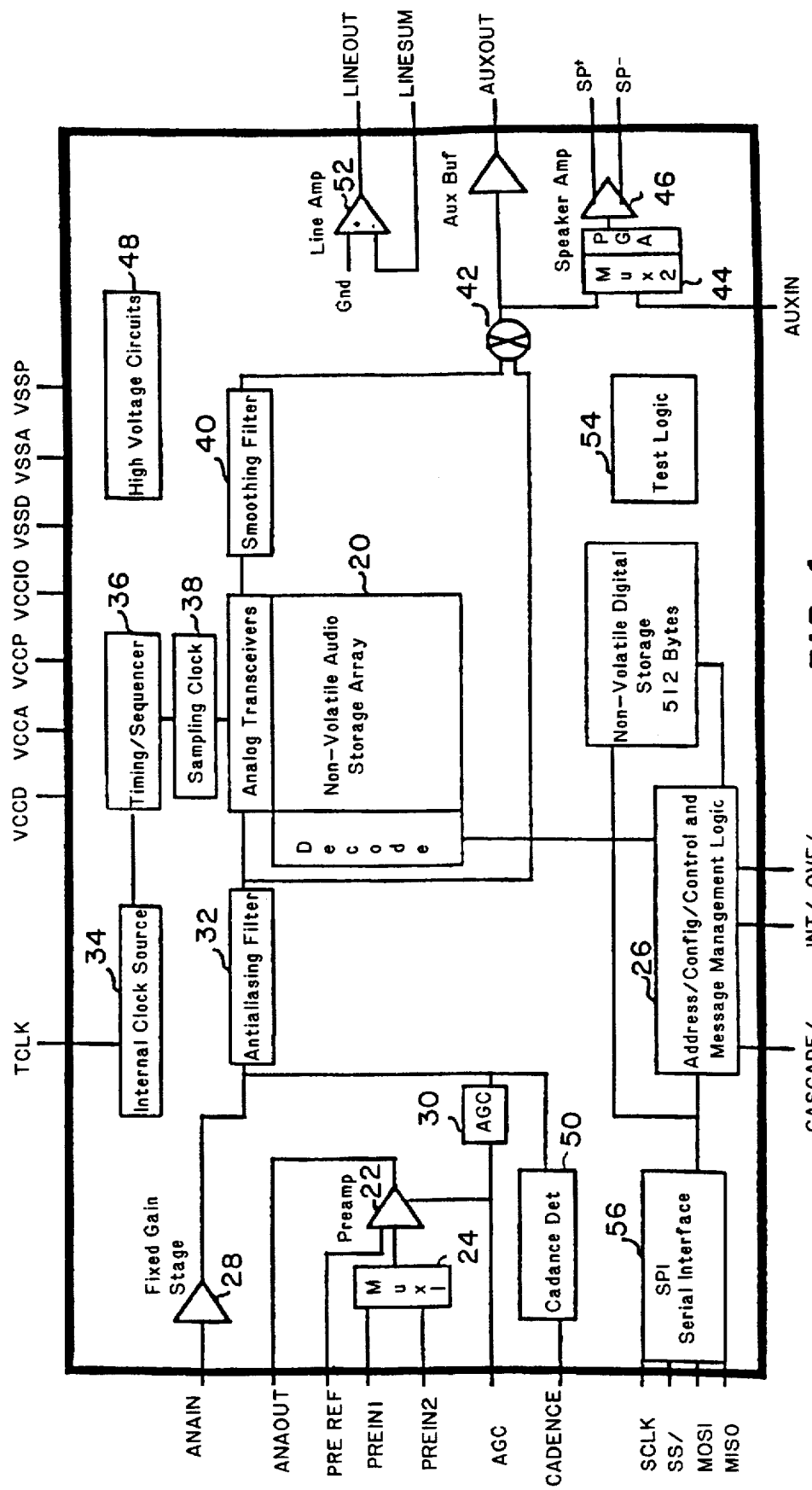
FIG. 1 is a block diagram of a preferred embodiment of the present invention.

Now referring to FIG. 1, a block diagram of a preferred embodiment of the present invention may be seen. The heart of the storage device is a nonvolatile storage array 20, in this embodiment capable of storing in analog sample form and playing back, ten minutes of analog (audio or speech) information sampled at a 6.4 KHz rate. For recording, a microphone, telephone speaker signal or corresponding signal is applied through one of the preamp inputs PREIN1 or PREIN2 to the preamplifier 22 through multiplexer 24 controlled by the address/configuration/control logic 26. The output of the preamp 22 is coupled to an output pin ANAOUT, which in turn is normally capacitively coupled through an external capacitor to the input ANAIN of a fixed gain amplifier 28, the output of which is provided to the automatic gain control (AGC) circuit 30, controlling the gain of the preamp 22. The output of amplifier 28 is also coupled to antialiasing filter 32, the function of which is to limit the upper frequency of the audio (or other analog) signal so that the signal frequency range does not violate the sampling theorem for the analog signal sampling and storing in the non-volatile storage 20. Alternatively of course, the audio signal input may be applied directly through the ANAIN terminal to the input of the fixed gain amplifier 28 if the audio signal has been properly pre-conditioned to be of appropriate amplitude, etc.

For both recording and playback, an internal clock source 34 provides a reference clock signal to the timing/sequencer circuit 36 which controls the sampling clock 38 to sample the analog signal from the antialiasing filter 32 at an appropriate audio signal reproduction rate and in conjunction with other circuitry on the chip, sequences the sampling of the audio signal and the storage thereof during recording and during playback of the recorded analog signal samples. During playback, the stored analog voltages are read from the non-volatile analog storage 20 at the same rate as they were taken and passed through a smoothing filter 40 and analog mixer 42 to provide the output signal AUXOUT. The output of mixer 42 is also coupled to a multiplexer 44 as is an auxiliary input AUXIN, the multiplexer 44 selecting between these two signals to drive a power amplifier 46 having a balanced output to directly drive a speaker if desired.

In the preferred embodiment, because of the similar characteristics desired and the circuit savings which result, the antialiasing filter 32 is actually switched between the input during recording and the output during playback so that the antialiasing filter 32 becomes the smoothing filter 40 during playback. In addition, high voltage generating circuits 48 for programming (recording) and erasing of the storage cells on chip (both analog and digital storage cells) are also provided on chip so that external high voltage power supplies are not required.

The foregoing general types of devices are described in U.S. Pat. Nos. 4,890,259 and 4,989,179. Further details may be found in U.S. Pat. No. 5,241,494, with details of various circuits used therein being shown in U.S. Pat. Nos. 5,126, 967, 5,220,531 and 5,243,239. Finally, cascading of such devices to extend the record and playback time is shown in U.S. Pat. No. 5,164,915, and a one-transistor non-volatile floating gate storage cell usable in an advanced version of such devices is shown in U.S. patent Ser. No. 981,610, filed Nov. 25, 1992. The disclosures of all of the foregoing patents and applications are incorporated herein by reference.

Other circuits on-chip, not particularly relevant to the present invention, include the cadence detector 50 and line amplifier 52 described in general in the Advanced Information Document for the preferred embodiment, attached hereto as Exhibit 1. Also described in the Advanced Information Document are the various power supply terminals and the test clock connection TCLK, used primarily for factory test purposes, and located on chip is various test logic 54, 512 bytes of digital non-volatile memory and SPI serial interface, also not relevant to the present invention.

The key features of this invention art that; a), message management can be performed through references to message or message segment numbers, and b), under the supervision of a conventional microcontroller or microprocessor, one can accomplish all the message management functions found in voice messaging systems, (i.e., telephone answering machines) by operating on a fixed number of read/write registers, e.g., selective save and delete of messages, skip forward or backward from message to message, re-numbering of messages, looping on messages, selective record and playback of messages by numbers, tagging of new messages, etc.

Referring again to FIG. 1, nonvolatile read/write registers form a stack in logic 26 in each analog storage device. The message management functions are performed through the manipulation of the message numbers in the stack registers. For example, in a telephone answering machine application, callers normally leave audio messages and the recipient listens to the messages and discretely saves or deletes some or all of these messages. The messages are normally numbered in an ascending order, e.g., lowest number representing the earliest message received and the highest number representing the latest message received or vice-a-versa. During the normal course of time, as the user saves and deletes messages and receives still further messages, the available storage space for recording new messages gets fragmented (not contiguous any more, but scattered across the storage media in small segments). To make efficient use of the storage medium (the ability to use the total available recordable space at any time even though fragmented), the present invention message management is used to convert this fragmented recordable space into one contiguous logical space without physically relocating messages and without packing the available fragmented space into one contiguous space.

In the description presented herein, the following definitions apply:

1. Message Segments: The smallest addressable message or piece of a message. Each message segment has a respective register linked to it that may be written to, to hold a message number for later reference. The set of registers in a single analog storage device is referred to as a stack in this description.

2. Message: All or part of one or more message segments. A unique number is associated with each message. The number of possible messages is determinedly the number of addressable message segments and the size of the register linked to each message segment. The size of the register means the number of individual storage cells forming the register, e.g., byte-wide means eight cells per register, capable of holding any of 256 numbers 0 through 255.

3. Message Number: A numerical reference to a message. One or more message segments may have the same message number. Contiguous or non-contiguous message segments may have the same message number. Message segments with the same message number (contiguous or non-contiguous), concatenated in a physical order, collectively form a message.

4. Stack Pointer: A pointer, one of which is associated with each register in a stack and used to directly address any message segment. The size of the stack pointer is that necessary to address the number of message segments in the system.

5. Message Stack: The message stack are the registers linked to each respective message segment. The depth of the message stack is the number of message segments in each device.

6. Overflow: Occurs whenever an attempt is made to address past the end of the stack. This may happen either through an internal operation of the system, or if addressed through the stack pointer.

7. Register: A register is a collection of memory cells. e.g., a byte wide register has eight memory cells that can be written to or read from simultaneously. These registers can be volatile or non-volatile.

Figure 2:
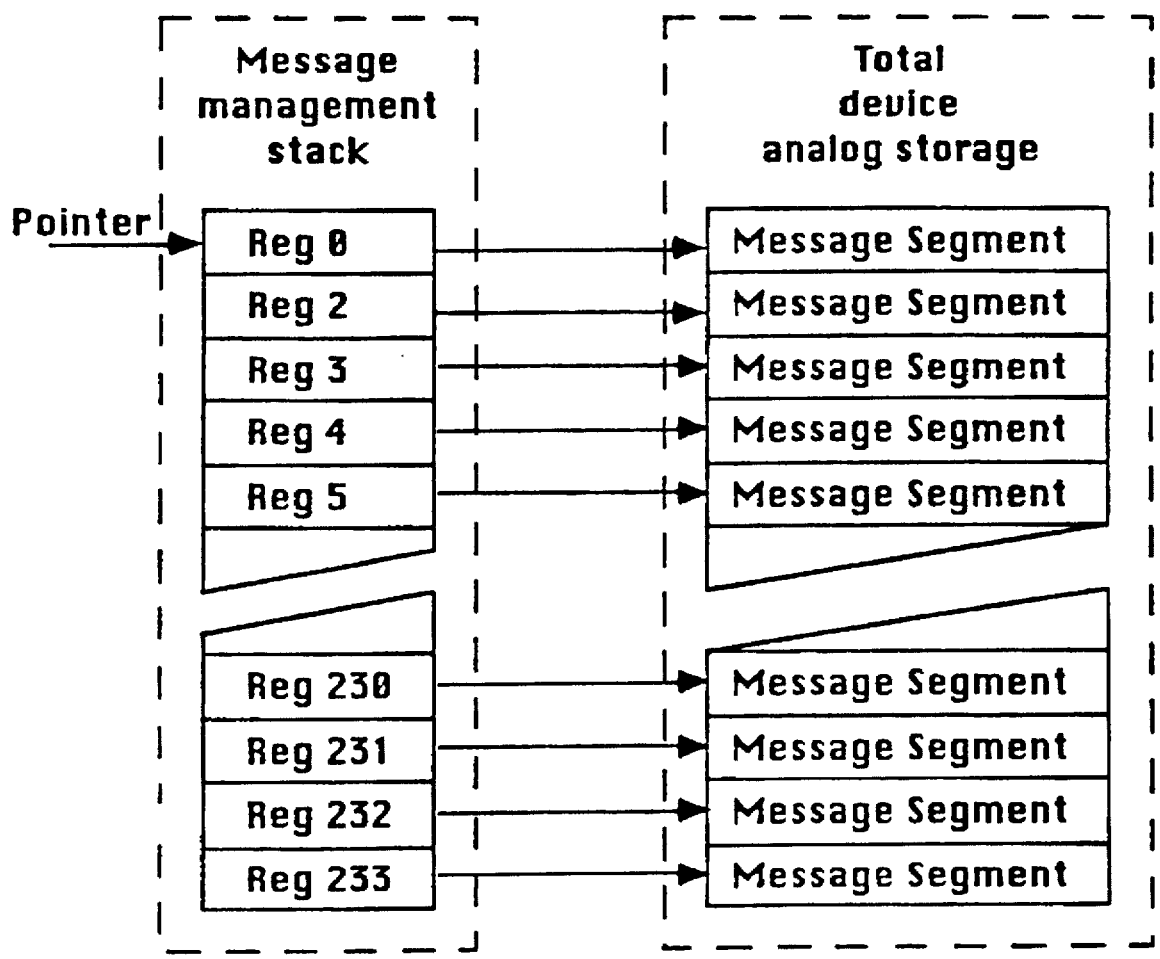
FIG. 2 illustrates the linking of the stack registers of each device to a respective addressable message segment.

The key to the method of the present invention is to work with a reasonable number of message segments. Assume in an exemplary embodiment that a device having a 10 minute storage capability at a sample rate of 6.4 KHz is used, that the maximum number of message segments is 234, and that a message segment, typically of the order of 2 sec. to 4 sec. in duration, is actually 2.54 sec. in duration (2.54 sec. per segment times 234 segments=10 minutes recording time). A message stack is required to keep track of these message segments. The stack should be wide enough to hold the maximum message segment number count (note that this maximum message segment count is also the maximum number of messages possible, for a single device, though alternatively a device could be designed with substantially cascading in mind where the total number of messages could exceed the number of message segments in one device, thereby calling for a nine or ten bit wide or wider stack.) In the embodiment being described, the stack is byte-wide, since there is 234 message segments on chip. The depth of the stack, which also means the total number of registers in the stack, should be equal to the total number of individually addressable message segment locations within a particular device, and the stack should be preferably a linear stack. Each register in the stack is linked to a respective addressable message segment, as shown in FIG. 2. Preferably the top register of the stack is linked to the first addressable message segment, the second stack register is linked to the second physical message segment etc., with the bottom stack register being linked to the last addressable message segment. The link between stack registers and physical message segment locations can be in any order desired, so long as it is fixed or predetermined.

Alternatively, a circular stack could be used if flag bits are used in the stack registers to signify the beginning and ending message segments of messages on a device.

Figure 3:
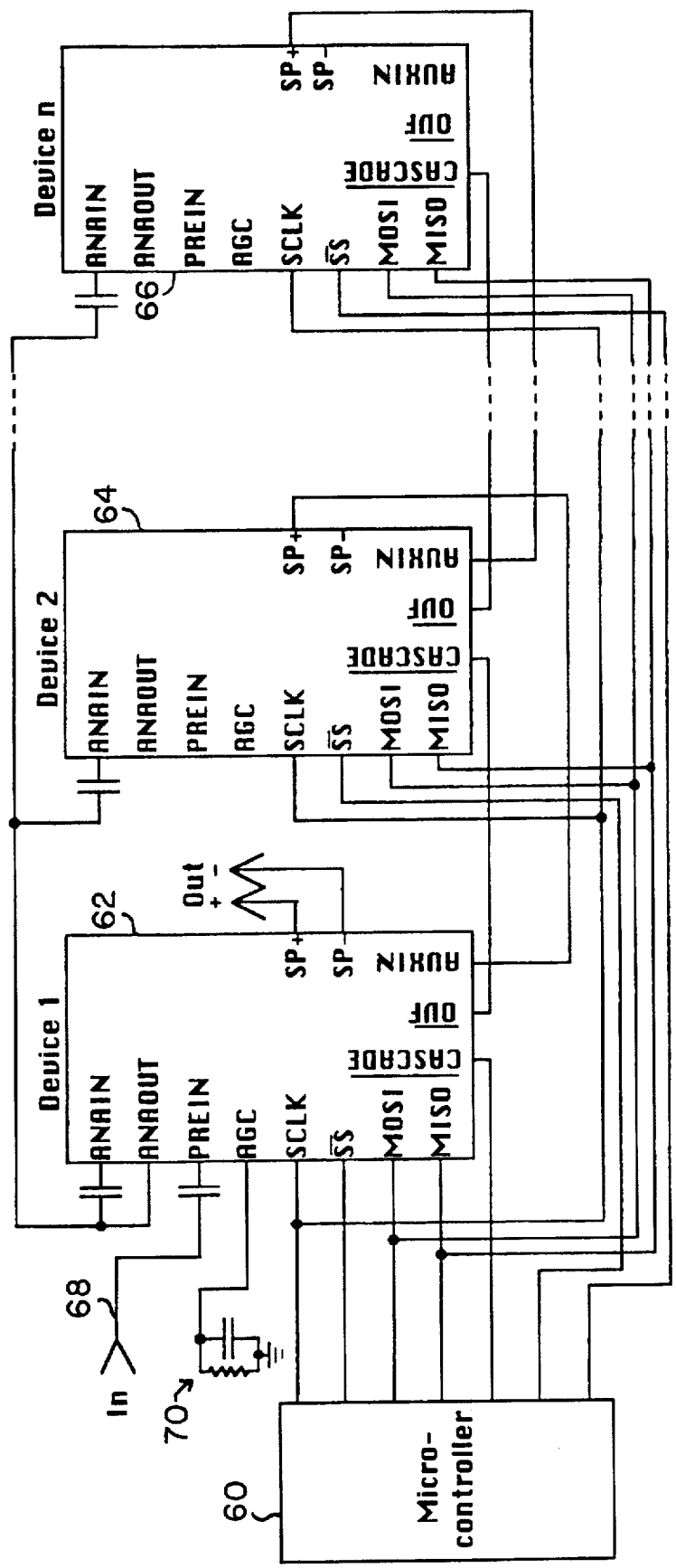
FIG. 3 is a circuit diagram showing the signal connections for a cascaded system comprising a microcontroller and a plurality of cascaded analog storage and playback devices.

Now referring to FIG. 3, the signal connections for a cascaded system comprising a microcontroller 60 and a plurality of cascaded analog storage and playback devices 62, 64 and 66 may be seen. As shown in FIG. 3, microcontroller 60 is connected in parallel to the four SPI port connections of each of the cascaded devices. Accordingly all control registers in the devices are set to the same conditions (or under certain circumstances, to different conditions) by the microcontroller, which typically operates on a program stored in read only memory (ROM) or EPROM or EEPROM. For recording, the analog signal IN on line 68, in a telephone answering machine the equivalent of the handset speaker signal, is capacitively coupled to the input of preamp 22 (FIG. 1) through connection PREIN of the first analog storage device. The preamp 22 and AGC circuit 30, the parameters of which are set by the external resistor-capacitor network 70, provides an amplitude controlled signal on the analog output ANAOUT pin of the first device, which in turn is capacitively coupled to the analog in connection ANAIN of all devices in parallel. Thus, with this connection, the preamp and AGC circuit of the first device provides the same amplitude controlled analog signal to all devices.

For playback, on the other hand, it will be noted that for all devices other than the first, the positive speaker output SP+ for each device is connected to the auxiliary input AUXIN for the prior device, thus daisy-chaining the devices in the reverse order, with the ultimate output of the cascaded devices being derived from the first device 62, typically in the form of a balanced output as shown. In that regard, when a particular device is itself playing back an analog signal stored in its own analog storage cells, multiplexer 44 will select as the input to the speaker amplifier 46 the output of the smoothing filter 40. At the end of its playback, which depending upon its mode of operation in accordance with the present invention, may be a playback of the last message segment in the storage device or alternatively the playback of the last message segment in the storage device having the message number commanded to be played back by the microcontroller, the input to the speaker amplifier 46 is switched by the multiplexer 44 to the auxiliary input connection AUXIN. This, coupled with the unity gain of the speaker amplifiers 46 in each device and the reverse daisy-chaining of the devices, results in the output signal of a device currently playing back being daisy-chained to the first device to provide the output signal OUT as shown. While the speaker amplifier 46 (FIG. 1) is a balanced output, the same may used as a single ended output if desired.

It will be noted that while the four SPI bus lines are in parallel to all devices, the $\overline{\text{CASCADE}}$ connection of only the first device is coupled to the microcontroller 60. Thereafter, each device has its $\overline{\text{CASCADE}}$ connection connected to the overflow $\overline{\text{OVF}}$ of the prior device, thus daisy-chaining all devices, so that while the microcontroller may set up all devices for either record or playback, it will trigger the operation initially of only the first device through the $\overline{\text{CASCADE}}$ connection. When the stack pointer hits the bottom of the stack in the first device, a stack overflow $\overline{\text{OVF}}$ is triggered. This overflow is communicated to the next device, if a plurality of storage devices are used as shown, triggering the stack pointer in the next device.

The data loaded in the stack registers is the binary equivalent of message numbers. There also is a binary equivalent code for the designation of a vacant message segment, preferably 00h (h→hexadecimal numbering system). In the beginning when the entire storage space is empty (or cleared), the 00h code is intentionally set in all of the stack register locations to indicate all are available for recording purposes. However after a few record and erase operations, wherein in the erase operations the stack registers for the respective message segments are reset to 00h to indicate a corresponding empty message segment storage location, these empty locations will be somewhat randomly distributed (fragmented) throughout the stack (or plurality of stacks of an equal number of identical concatenated storage devices), as stated earlier, thereby necessitating the garbage collection capability. Before a recording can begin, the stack pointer (counter) in the storage device or the first storage device in a chain of such devices, (which also represents the physical address for the message segment), starts stepping down the stack until a location with 00h therein is found. At this point the message number of the current message is stored in this location and the recording begins at the pointed to physical message segment location. After the message recording begins at that segment, the pointer continues in a look-ahead search down the stack to locate another empty message segment position as will be indicated by a 00h code in the respective empty stack register. If the pointer finds a register with 00h therein, it stays at this location until the previous segment gets filled, at which time the message number is stored in the current stack register and the recording continues transparently at the presently pointed to message segment. The pointer then moves on, looking ahead for still another empty 00h location in the stack. This continues until the stack pointer hits the bottom of the stack and an overflow trigger is generated. If only a single storage device is used, this will stop the recording. If a plurality of devices are used as shown in FIG. 3, the overflow is coupled to the next device and the stack pointer therein repeats the process described for that device, etc. until the last device in the chain is reached. The recording can also be stopped anytime before the last overflow is reached, as is normally most likely, by a normal end of record operation triggered by the microcontroller in response to some operating parameter or characteristic of the system, such as in a telephone answering machine a detected hangup by the caller, a lack of a cadence signal from the first analog storage device in the chain, or a message length limit from a timeout of the microcontroller. In this case, an EOM (End-Of-Message) marker is written at the point in the segment where the recording ended. The EOM markers are digital markers which may be stored in memory cells provided on each analog storage device just for that purpose. Such markers are used in the ISD 1016 device, and described in the literature thereon, in the Appendix hereto and in detail in U.S. Pat. No. 5,241,494.

To play a message, the microcontroller provides the message number to all devices 62, 64 and 66 over the SPI bus, and initiates a play operation in device 62 by a signal on the cascade line. The stack pointer in the first device 62 starts from top of the stack and steps down until the message number in the associated stack register compares with the message number initially provided over the SPI bus. The playback is performed from this message location as the stack pointer continues a look-ahead for the next stack location with the same message number. If it finds one, it stops at that location until the previous message segment play is completed, at which time the present segment pointed to immediately begins playing in a seamless manner transparent to the listener. As this segment starts playing back, the pointer then moves further down the stack, etc., until the bottom of the stack is hit and the overflow is triggered. Note that the playback may stop any time earlier by the detection of the EOM bit, at which time the playback operation is complete and thus stops. When the overflow is triggered, it provides the initiating cascade signal to the second device 64, which in turn will replay all its message segments of the same number, etc. until either an end of message EOM signal is found in one of the devices for this message number, or alternatively, all message segments of the same message number in all devices have been replayed in order.

This play operation with the stack is very similar to the record operation, with the difference that during recording the stack pointer looks ahead searching for the empty (00h) code and then loads the message number in place of the empty code, whereas during playback the stack pointer is looking ahead searching for the specific (non-00h) message number.

In both the record and playback operations, the look-ahead is done at digital speeds, not analog (voice) rates. Consequently many devices may be cascaded in a relatively large system and the first segment of a particular message actually stored in one of the later devices, yet the time to locate the first message segment will be sufficiently short so as to be transparent to the user. Similarly, of course, during recording, a large number of devices may be searched for the next stack register containing 00h, so that even if the next segment to be stored can only be stored many devices down the cascaded string, the same will be ready to transparently start recording as soon as the current segment recording is completed, and during playback, the resulting physically disparate message segments may be seamlessly located and sequentially played back in a manner transparent to the user.

An erase of a certain message may be performed by providing the message number to all devices through the SPI bus and then initiating an erase operation. At this time the stack pointer sequentially steps through the stack in each device, as in a record and playback operations, and locates all the locations which have the message number and writes the empty code 00h. One does not have to erase the array, as writing the empty code 00h into the proper stack register locations essentially releases the associated storage area of the device for further writing, and like the ISD 1016 device hereinbefore referred to, writing is always immediately preceded by a single pulse erase cycle to clear the associated storage cells for the storage of the new message segment. Note in this regard, the empty code is stored in a digital storage space, not an analog storage space, so that this writing operation is a fast one shot storage operation rather than the iterative write of the analog storage of the ISD 1016 type devices.

Reordering of message numbers can be permanently performed by the microcontroller by changing the message numbers in the stack registers appropriately, or temporarily in memory associated with the controller. No physical transfer of messages is required in the array. Skipping forward messages can be initiated by the microcontroller by loading a message number other than that of the first message and requesting a play operation. Repeating earlier messages can also be initiated by the microcontroller by loading in the message number and requesting a play operation. Playback of all messages can be also be performed by the microcontroller through iteratively incrementing the message number with each request of a play operation until the final message play request is complete. Selective erase and save can also be performed by the microcontroller by just changing the message numbers in the stack to 00h for the messages that are to be deleted. A message can be appended to a previous message by requesting a record operation with the same message number to which message appending is required, and then appending the new message after the last message segment of the previous message. In that regard the microcontroller may read or write to the stack pointers at any time, and therefore can determine where all message segments of a given message are, thus giving the overall system great flexibility and versatility, such as concatenating messages, splitting a message to inject inserts, etc.

For looping on a message, the microcontroller provides the message number and initiates a loop play operation. The stack pointer in this mode essentially starts from the top of the stack and plays all the segments with the selected message number and jumps back to the top and repeats this sequence until the operation is stopped. Hard message segment boundaries can be set up by programming the appropriate segment numbers into the proper stack registers and never changing it again. This for instance, could be used in an answering machine where the answering message is to be protected from write-overs, even though other old messages are to be written over. Additionally, the message pointer can be moved backward from segment to segment, or caused to move back n segments at a time to allow reviewing/rewinding of messages or message portions, such as the repeat of a phone number to allow writing down and verification of the number without requiring replay of the entire message or message list. Specific single or multiple bits of the stack registers can be set aside for the purpose of setting special flag information, e.g. old or new messages, private message, urgent message, saved message, etc. Note that when some bits of the stack register are to be set aside for flag information, the maximum number of addressable messages will be determined by the number of stack register bits left for message number identification purpose. The sum of the flag bits and the message number bits will make up the total width of the stack register.

Figure 4:
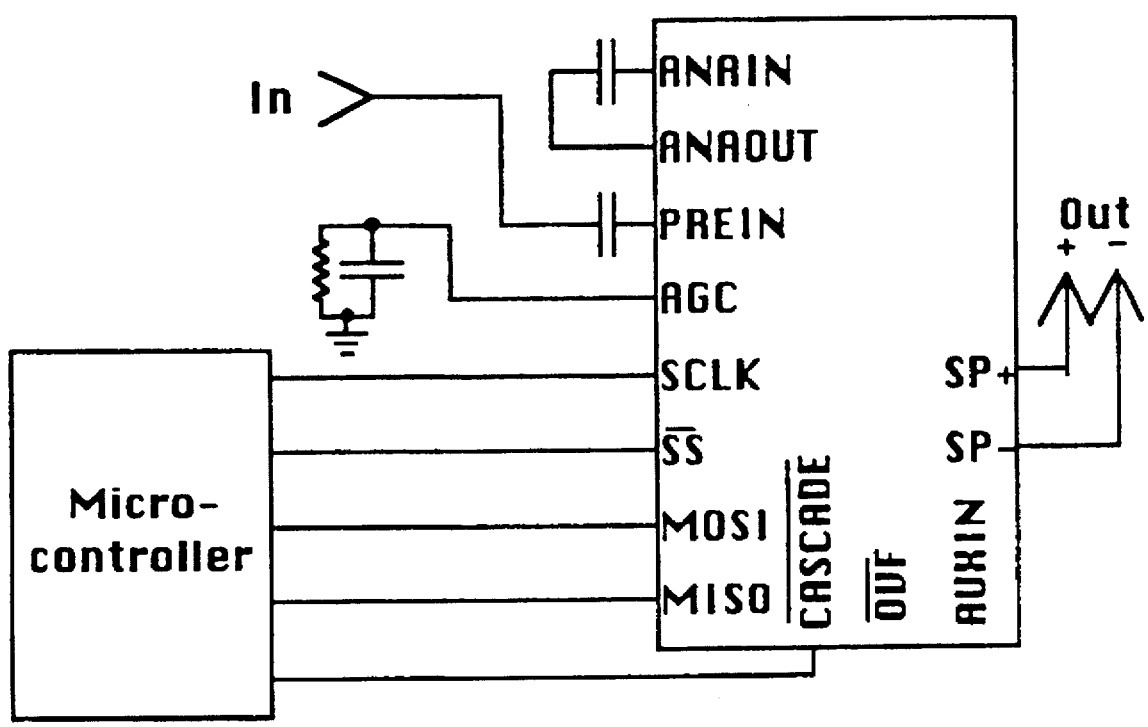
FIG. 4 is a circuit diagram similar to FIG. 3 showing the signal connections for a system comprising a microcontroller and a single analog storage and playback device.

Having now described the operation of the device of the present invention in a generalized cascaded system of n devices, it will be apparent that substantially any number of such devices may be cascaded as desired. In the event that the number of devices to be cascaded exceeds the number of available individual port lines on the microcontroller to be used, one or more groups of m port lines may be used for providing up to $2^m$ binary coded $\overline{SS}$ signals which are decoded to accommodate up to $2^m$ cascaded devices. Also from the prior description, it will be apparent that the number of "cascaded" devices may simply be one, as shown in FIG. 4, with all of the various functions and capabilities of a larger system being preserved, albeit with a lower total recording and playback time capability.

The present invention has to this point been described in term of a voice messaging system. It should be noted however, that the messages could be in the form of data messages. In particular, the present invention could also be used for managing data files as normally found in computer file systems and solid state data storage systems, particularly such systems as are or may be required to handle files of variable length. In the case of data in the preferred embodiment, the data may be conventionally binary encoded as high and low voltages, or higher order multilevel voltages may be used. By way of example, four voltage levels may be used to effectively store two bits per memory cell.

The present invention has been disclosed and described with respect to a certain preferred embodiment thereof, it will be understood to those skilled in the art that the present invention may be varied without departing from the spirit and scope thereof.

We claim:

1. An integrated circuit storage device for storing and selective playback of messages comprising:
    a storage array having a plurality of storage cells;
    input circuitry for sequentially providing input information to the storage cells for storage therein during a record operation;
    output circuitry for sequentially providing as an output during a playback operation, information stored in the storage cells;
    a plurality of registers, each register being associated with a respective series of storage cells of the storage array and capable of storing a message identifier;
    communication circuitry for receiving control signals from another source;
    stack pointer and control circuitry responsive to the communication circuitry for sequentially locating each successive register storing the specific message identifier specified by the communication circuitry and causing the output circuitry to seamlessly provide as the output, information stored in the respective series of storage cells associated with each successive register storing the specific message identifier during a playback operation.

2. The integrated circuit storage device of claim 1 wherein the stack pointer and control circuitry is further responsive to the communication circuitry to locate registers having a specific message identifier therein and for those registers, to replace that specific message identifier with a reference identifier.

3. The integrated circuit storage device of claim 2 wherein the stack pointer and control circuitry is further responsive to the communication circuitry during a record operation to successively locate registers having the reference identifier therein, to sequentially provide input information to the series of storage cells associated with those registers, and to replace the reference identifier in the respective registers with a specific message identifier.

4. The integrated circuit storage device of claim 3 further comprised of cascade circuitry and overflow circuitry, the cascade circuitry being responsive to an external signal to initiate a read or write operation within the integrated circuit as directed through the communication circuitry, and the overflow circuitry providing a signal coupleable to the cascade circuitry of an identical integrated circuit for seamlessly initiating a read or write operation therein after the stack pointer and control circuitry has searched all registers to sequentially locate each successive register storing the specific message identifier specified by the communication circuitry for the read or write operation.

5. The integrated circuit storage device of any one of claims 1 through 4 wherein the communication circuitry is responsive to a Service Provide Interface (SPI) bus signals.

6. The integrated circuit storage device of any one of claims 1 through 4 wherein the input information is an analog signal, the storage array is an analog voltage storage array and the input circuitry includes sample and hold circuits for periodically sampling an analog signal for storage of the samples in the analog voltage storage array.

7. The integrated circuit storage device of claim 6 wherein the communication circuitry is responsive to a Service Provide Interface (SPI) bus signals.

8. The integrated circuit storage device of any one of claims 1 through 4 wherein the message is digital information.

9. A method of recording and playback of messages of varying length comprising the steps of:
    (a) providing storage media having a storage capacity by which a plurality of messages may be stored;
    (b) providing a plurality of registers and associating each with a respective portion of the storage media on which a message segment may be stored;
    (c) for the recording of a message, successively locating registers having a reference identifier stored therein, changing the reference identifier stored therein to a specific message/identification and storing segments of the message therein until the entire message is stored;
    (d) for the playback of a specific message, successively locating registers having the specific message identifier stored therein and playing back the respective message segments in order until the entire message is played back.

10. The method of recording and playback of messages of varying length of claim 9 further comprising the elimination of a recorded message comprising the step of:
    successively locating registers having the message identifier stored therein for the message to be eliminated and for those registers, changing the message identifier to the reference identifier.

11. The method of any one of claims 9 or 10 wherein in steps (a) and (b), the storage media and the plurality of registers comprise a plurality of integrated circuits, each having a respective portion of the storage capacity and a respective portion of the registers thereon.

12. The method of claim 11 wherein each integrated circuit provides a signal coupleable to the next successive integrated circuit to seamlessly initiate a record, playback or message elimination process in the next successive integrated circuit upon completion of the same in the previous integrated circuit.

13. The method of claim 11 wherein the messages are voce messages.

14. The method of claim 11 wherein the messages are digital information.

15. An integrated circuit storage device for storing and selective playback of voice messages comprising:

a storage array having a plurality of storage cells, each for storing in analog voltage form, one sample of a plurality of successive samples of audio signals;

input circuitry for sequentially receiving an audio signal and providing sequential samples thereof to the storage cells for storage therein during a record operation;

output circuitry for sequentially providing as an output during a playback operation, samples of the audio signal stored in the storage cells;

a plurality of registers, each register being associated with a respective series of storage cells of the storage array and capable of storing a message identifier in digital form;

communication circuitry for receiving digital control signals from another source;

stack pointer and control circuitry responsive to the communication circuitry for sequentially locating each successive register storing in digital form a specific message identifier specified by the communication circuitry and causing the output circuitry to seamlessly provide as the output, the audio signal samples stored in the respective series of storage cells associated with each successive register storing the specific message identifier during a playback operation.

16. The integrated circuit storage device of claim 15 wherein the stack pointer and control circuitry is further responsive to the communication circuitry to locate registers having a specific message identifier therein and for those registers, to replace that specific message identifier with a digital reference identifier.

17. The integrated circuit storage device of claim 16 wherein the stack pointer and control circuitry is further responsive to the communication circuitry during a record operation to successively locate registers having the reference identifier therein, to sequentially provide audio signal samples to the series of storage cells associated with those registers, and to replace the reference identifier in the respective registers with a specific message identifier.

18. The integrated circuit storage device of claim 17 further comprised of cascade circuitry and overflow circuitry, the cascade circuitry being responsive to the state of an external signal to initiate a read or write operation within the integrated circuit as directed through the communication circuitry, and the overflow circuitry providing a signal coupleable to the cascade circuitry of an identical integrated circuit for seamlessly initiating a read or write operation therein after the stack pointer and control circuitry has searched all registers to sequentially locate each successive register storing the specific message identifier specified by the communication circuitry for the read or write operation.

19. The integrated circuit storage device of any one of claims 15 through 18 wherein the communication circuitry is responsive to a Service Provide Interface (SPI) bus signals.

* * * * *

UNITED STATES PATENT AND TRADEMARK OFFICE
CERTIFICATE OF CORRECTION

PATENT NO. : 5,664,060
DATED : September 2, 1997
INVENTOR(S) : Jarrett et al.

It is certified that error appears in the above-identified patent and that said Letters Patent is hereby corrected as shown below:

In the title page, item [56] References Cited, please insert --

4,780,855   10/1988   Norihiko et al.

FOREIGN PATENT DOCUMENTS 2 253 078 A   8/1992   Great Britain --.

In the title page, item [56] OTHER PUBLICATIONS, please insert --

"Pseudo Analogue Solid State Storage", Electronic Engineering, October 1993.

"Analogue Data Storage - Speaking of the Future?", Electronics World + Wireless World, February 1992 --.

In column 4 at line 46, please delete " determinedly " and insert -- determined by --.

In column 6 at line 23, please delete " may used " and insert -- may be used --.

Signed and Sealed this

Twenty-seventh Day of January, 1998

Attest:

BRUCE LEHMAN

*Attesting Officer*     *Commissioner of Patents and Trademarks*